United States Patent
Sandusky

[19]

[11] Patent Number: 6,112,125
[45] Date of Patent: *Aug. 29, 2000

[54] SELF-TUNING METHOD AND APPARATUS FOR CONTINUOUS-TIME FILTERS

[75] Inventor: Randall L. Sandusky, Divide, Colo.

[73] Assignee: Silicon Systems, Inc., Tustin, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/401,073

[22] Filed: Mar. 8, 1995

[51] Int. Cl.⁷ .................................................. G05B 13/02
[52] U.S. Cl. ................................ 700/28; 700/35; 700/37; 700/71
[58] Field of Search ..................... 327/524, 551, 327/552, 553; 331/17, 18, 25; 333/174, 166; 700/28, 35, 37, 46, 71, 72

[56] References Cited

U.S. PATENT DOCUMENTS

| Re. 33,267 | 7/1990 | Kraus | 364/158 |
|---|---|---|---|
| 4,903,192 | 2/1990 | Saito et al. | 364/157 |
| 5,124,593 | 6/1992 | Michel | 307/521 |
| 5,256,981 | 10/1993 | Fountain | 328/14 |
| 5,281,931 | 1/1994 | Bailey | 333/17.1 |
| 5,384,502 | 1/1995 | Volk . | |

*Primary Examiner*—Paul P. Gordon
*Attorney, Agent, or Firm*—W. Daniel Swayze, Jr.; W. James Brady, III; Frederick J. Telecky, Jr.

[57] ABSTRACT

A self-tuning technique for integrated continuous-time filters. The present invention provides a method and apparatus to compensate for post-fabrication or in-operation discrepancies between desired and measured filter characteristics due to variability of the IC fabrication process or due to drift caused by changing conditions such as voltage, temperature. The present invention requires minimal overhead in power and area requirements. Furthermore, the filter being tuned is used to process signals, unlike in the prior art where a similar but separate filter or oscillator is used to tune the bias values for both circuits. Better tuning accuracy is thus obtained in the present invention. The circuit is designed to initiate a self-tuning cycle at power-up or during operation after power-up. Tuning is achieved by injecting a reference signal, and monitoring the phase of the filter output with respect to the phase of the reference signal. The self-tuning circuit then provides a signal to a trim DAC, which applies the appropriate correction signal.

39 Claims, 10 Drawing Sheets

SELF-TUNING METHOD AND APPARATUS FOR CONTINUOUS-TIME FILTERS

BACKGROUND OF THE INVENTION

1. Field of the Invention

This invention relates to the field of self-tunable filters, and, in particular, to self-tunable continuous-time filters.

2. Background Art

In the field of electronic signal processing, continuous time (CT) filters have been used by designers to modify the phase and amplitude characteristics of analog signals. In the prior art, these filters have been constructed of discrete elements where each element has an accuracy within a desired range, or as an integrated circuit.

Integrated circuit continuous-time filters are often used for applications in the megahertz frequency range. Unlike switched capacitor filters, integrated circuit continuous time filters can avoid signal aliasing and noise problems. However, such filters have difficulty achieving equivalent tuning precision, stability and linearity. For example, in an integrated circuit CT filter, the pole frequency is inversely proportional to an RC (or $g_m/C$) time constant, which is subject to large uncontrollable absolute component variations. Consequently, a post fabrication adjustment of the pole frequency to the nominal design value by means of trimming or tuning is generally required.

In the trim method, the pole frequency is adjusted only once, usually at wafer probe. The circuit is designed to minimize variations of the target cutoff frequency, Fc, over temperature and supply voltages as well as over the cutoff frequency range (in the case of a programmable filter). The advantages of this method are its simplicity and the absence of interference from a reference and on-chip tuning circuitry. The disadvantage is that it requires the measurement of Fc. Accurate measurement of a filter's pole frequency in the megahertz range is extremely difficult, especially on a production tester (e.g., Automatic Test Equipment, ATE). Further, wafer trimming is historically inaccurate and unreliable, and the device yields have been reduced, lowering the overall cost margins. The increased test time of the chips has also contributed to lower margins.

An alternative to trimming is the tuning method. The automatic or "self-tuning" of prior art continuous time integrated filters typically falls into one of two categories, a continuous tuning method whereby the filter can operate continuously while being tuned; and secondly, a method whereby the filter must be tuned in a signal-free environment. Continuous tuning methods have dominated prior art devices to date. An example of a continuous tuning system is illustrated in FIG. 3A, where the block diagram of a master-slave tuning control circuit is illustrated.

Figure 3A:
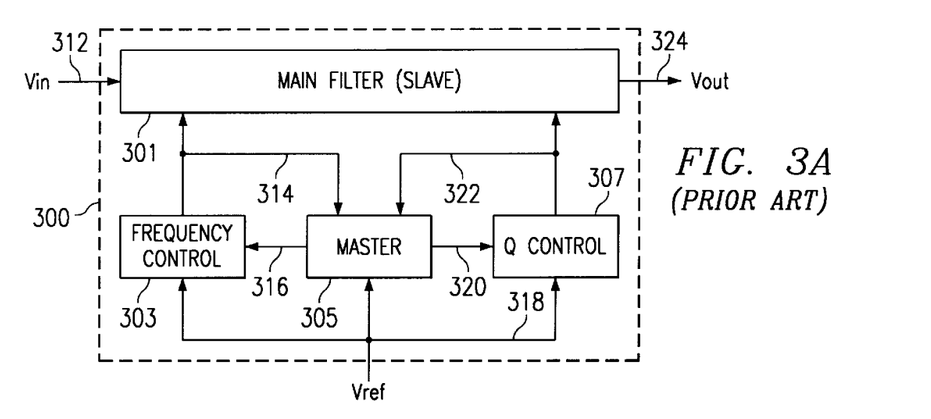
FIG. 3A is a block diagram of a prior art master-slave tuning control circuit.

In the example of FIG. 3A, an input Vin is provided to main filter 301 through node 312. Main filter 301 outputs $V_{out}$ on node 324. $V_{ref}$ is provided at node 318, which is coupled to a master filter section 305, a frequency control block 303, and a Q control block 307. The master filter section 305 matches the performance of the main filter (slave) 301 normally used for signal processing. The master section may be a duplicate of the main filter or a subsection of the main filter which is sufficient to model its behavior. Tuning is performed by injecting a reference signal of known frequency at input $V_{ref}$, comparing the performance of the main filter with that of the master, and then applying a correction signal to both the master and slave sections to eliminate the error.

Correction of frequency errors is achieved by the frequency control block which receives an input from master 305 through node 316 and detects frequency differences in the response of the master to the reference signal $V_{ref}$ to generate a control voltage at node 314 that is applied to master section 305 in a closed-loop fashion and to main filter 301. Master section 305 provides an output to Q control 307 through node 320. Since the behavior of the slave 301 is closely matched to that of master 305, the errors of the main filter 301 will be eliminated as master 305 is tuned in this fashion. Q control block 307 tunes the bandwidth of the filter by adjusting the pole quality factor Q in a manner similar to that of frequency control block 303. The error voltage for the Q tuning loop is generated by detecting the response of master section 305. The output of Q block 307 is provided to node 322, which is coupled to main filter 301 and to master section 305 in a closed-loop fashion.

For accurate tuning, the master-slave approach requires the matching of the master and main filter sections. Since filter circuits can occupy a large area in the integrated circuit design, master and main filter sections may be separated by some distance on the chip resulting in poor device matching. This is especially true of parasitic effects which can dominate high-frequency and high-Q designs, making it difficult to obtain good matching.

Due to the extra circuitry of the master filter section, the master-slave technique can also require excessive area in integrated circuit design such that the total area occupied by the filter is prohibitively large for chip designers. Depending on the configuration of the master section, the size of the tuning circuit may be 30–100% of the size of the main Filter.

Additional problems can arise when there is crosstalk between the master and slave sections. This is caused by the filter operating continuously while being tuned. The noise generated by the switching and control circuits of the tuner can also introduce inter-modulation distortion effects and degrade the overall signal-to-noise ratio of the system.

Figure 3B:
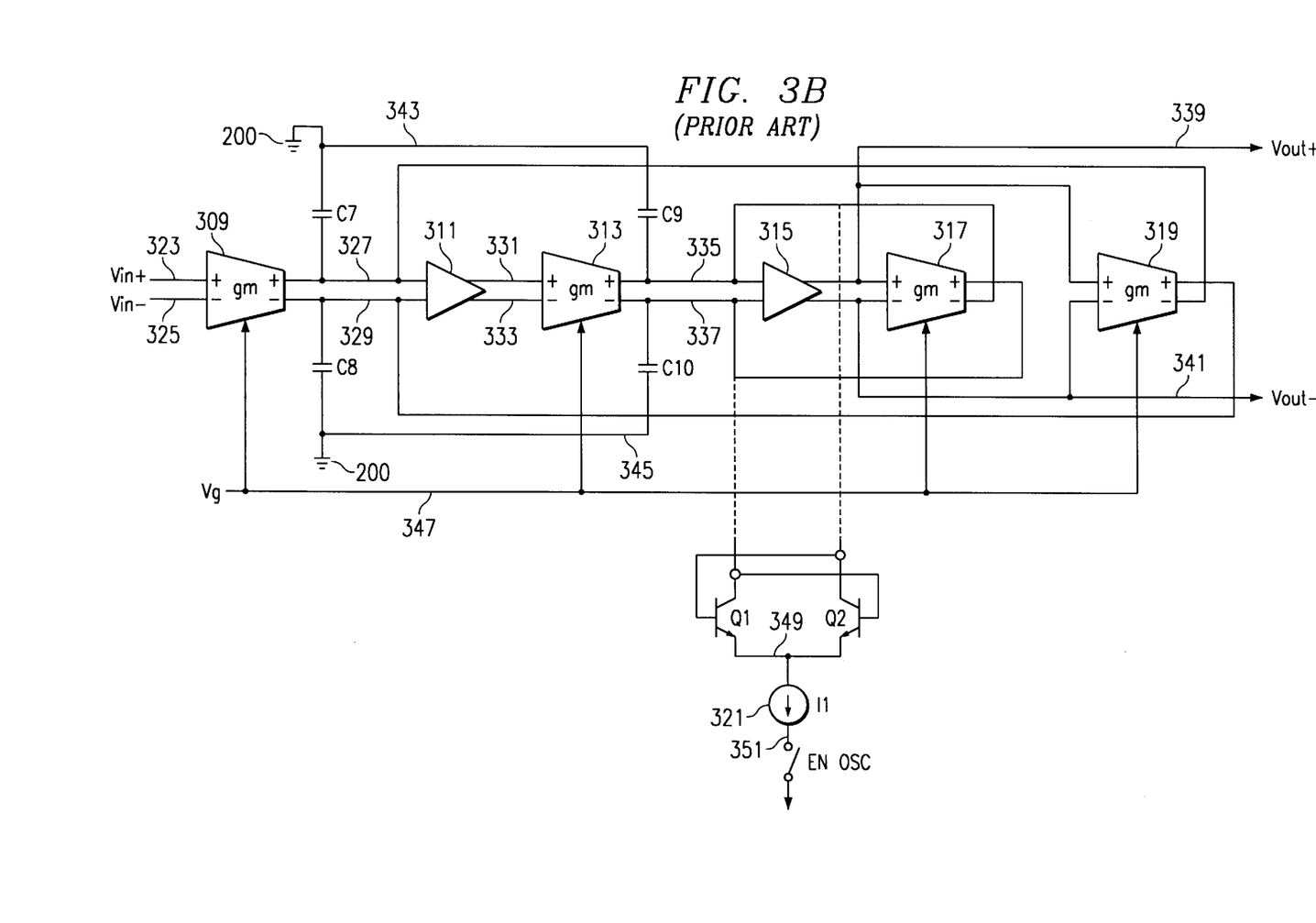
FIG. 3B is a block diagram of a prior art biquadratic $g_m$-C oscillator tuning circuit.

A second method of tuning in prior art devices is shown in FIG. 3B (tuning performed in a signal-free environment). FIG. 3B illustrates a biquadratic subsection of a filter. In the circuit of FIG. 3B, the biquadratic section is made to oscillate by introducing a negative resistance at the capacitive circuit nodes.

Referring to FIG. 3B, differential inputs Vin+ and Vin– are provided to a transconductance amplifier 207 through nodes 323 and 325 respectively. The positive output port of the transconductance amplifier 207 is taken at node 327, which is coupled to capacitor C7, the positive input port of buffer 311, and the negative output port of a transconductance amplifier 319. The negative output port of the transconductance amplifier 309 is taken at node 329, which is coupled to capacitor C8, the negative input port of buffer 311, and the positive output port of the transconductance amplifier 319. The positive and negative output ports of buffer 311 are coupled to the positive and negative input ports of transconductance amplifier 313, respectively, through nodes 331 and 333. The positive output port of a transconductance amplifier 313 is taken at node 335, which is coupled to capacitor C9, the positive input port of buffer 315, and the negative output port of a transconductance amplifier 317. The negative output port of the transconductance amplifier 313 is taken at node 337, which is coupled to capacitor C10, the negative input port of buffer 315, and the positive output port of the transconductance amplifier 317. Capacitors C7–C10 are coupled to a stable reference node 200, for example a ground. The positive output port of buffer 315 is coupled to node 339, which is coupled to the positive input ports of the transconductance amplifiers 317 and 319. The negative output port of buffer 315 is coupled to node 341, which is coupled to the negative input ports of transconductance amplifiers 317 and 319. Control voltage $V_g$ is fed to the transconductance amplifiers 309, 313, 317, and 319 through node 347 for tuning purposes. The positive and negative output ports of buffer 315 are connected to the lowpass output ports (Vout+ and Vout−) of the second-order filter. A pair of transistors Q1 and Q2 are coupled to the biquadratic section. The transistor Q1 is coupled to the node 337 in its collector circuit. The transistor Q2 is coupled to the node 335 in its collector circuit. The emitters of Q1 and Q2 are coupled to node 349, which is coupled to current source 321. Current source 321 is coupled to node 351, which is coupled to switch ENOSC.

When ENOSC switch is closed, the negative impedance circuit, comprised of transistors Q and Q2, effectively causes $g_{m2}$ to become negative, causing the biquadratic section to oscillate with a frequency near that of the pole locations. Once the oscillation frequency is detected, a correction signal is applied to trim the filter to its proper operating value. A disadvantage of this approach is the poor correlation of the oscillation frequency to the cutoff frequency. Due to parasitic effects and device mismatches in integrated circuit design, the oscillation frequency may not track the cutoff frequency of the filter with sufficient fidelity, producing poor tuning results.

SUMMARY OF THE INVENTION

The present invention describes an improved method and apparatus for the self-tuning of continuous time (CT) filters whereby accurate frequency and phase characteristics can be obtained with minimal overhead in area and power requirements. Automatic tuning circuitry is applied to a continuous time integrated filter to compensate for post-fabrication or in-operation cutoff frequency drift. The self-tuning control circuit monitors the phase of the filter output with respect to the phase of a reference signal injected at the filter input. Correlation of the phase and frequency response of filter allows the cutoff frequency to be tuned once the appropriate correction signal is applied. The present invention eliminates device-matching requirements and offers better accuracy and reliability by using the filter itself to obtain the calibration signal.

In the preferred embodiment of the invention, the continuous-time filter comprises several biquadratic filter sections which are in turn composed of integrators made up of capacitors and transconductance amplifiers in feedback. A self-tuning control circuit and proportional trim DAC are provided for automatic tuning. A reference signal is injected at the filter input and the output of the filter is monitored and compared with the reference signal to trim the cutoff frequency. The self-tuning control circuit then provides the output to the proportional trim DAC, which scales the cutoff frequency DAC in proportion to the digital value and provides a control signal to a cutoff frequency bias generator.

A self-tuning cycle is initiated once at power-up to eliminate filter errors due to process variations and/or the self-tuning cycle can be initiated during adverse drive conditions to compensate for changes in supply voltage and ambient temperature which have occurred since power-up.

DETAILED DESCRIPTION OF THE INVENTION

The present invention is a self-tuning method described with respect to integrated circuit high frequency continuous-time filters. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

In integrated continuous-time filters, process variations cause variations in circuit elements such as capacitors. These variations cause the poles of continuous-time filters to deviate from their desired locations resulting in undesired frequency response characteristics, e.g. misplacement of the cutoff frequency. In order to obtain accurate filter performance, low tolerance component values must be obtained. Unfortunately, this is not possible in integrated circuit design where the absolute value of the resistors, capacitors, and $g_m$ stages may vary from 10–30% or more depending on the process. This problem can be solved by automatic tuning circuits which effectively reduce component variances to allow accurate placement of the poles and zeroes in the transfer function.

Automatic tuning methods of the prior art rely on a duplication or oscillator scheme. These prior art methods require large area and power overhead for duplicate filters or oscillators and are often inaccurate and unreliable due to device mismatching and parasitic effects. The duplication schemes have the added disadvantage that they never tune the filter directly, but rely on matching of components between master and slave portions of the integrated circuit.

In order to tune an integrated CT filter, it is desirable to measure and correct for the tuning errors of the filter itself, as opposed to the master-slave approach which relies upon the device matchings of the master filter stage for accuracy. The present invention, uses a signal-free environment tuning approach. The present invention eliminates the need for wafer probe trim of programmable CT filters while using minimal power and area beyond that required for the filter circuit itself. Further, the present invention tunes the filter circuit directly, achieving more accurate and reliable results than the prior art methods.

One of the benefits of the present invention is improved accuracy through the elimination of errors caused by device mismatches of the master and slave sections, as well as possible noise and crosstalk effects. In the preferred embodiment of the present invention, a calibration reference signal injected at the filter input is qualitatively measured at the actual filter output with respect to the component of interest, which in the preferred embodiment is phase.

Figure 1:
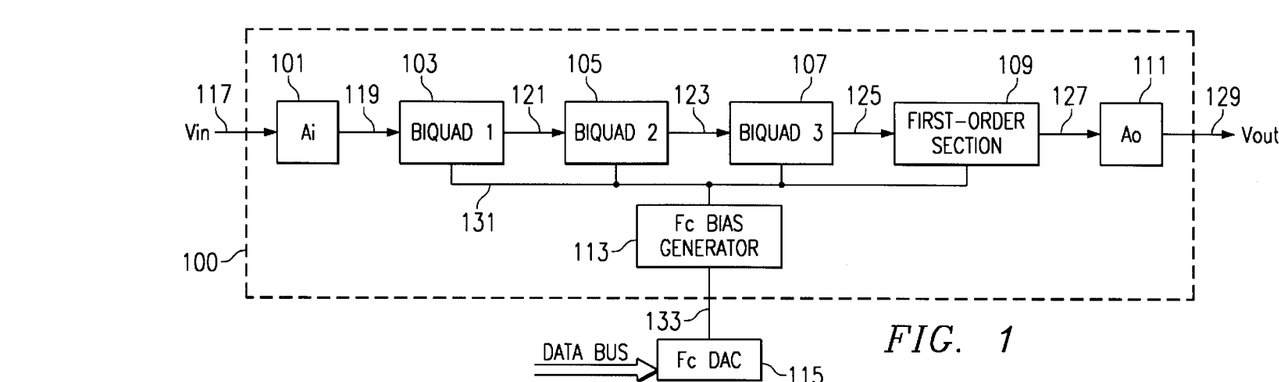
FIG. 1 is a block diagram of a 7th-order continuous-time filter.

An example of one currently available fully integrated CT filter is given in FIG. 1. FIG. 1 illustrates a block diagram of a 7th-order low-pass circuit. As is typical in integrated filters of this type, complex poles are realized using either OpAmps or Operational Transconductance Amplifiers (OTA's) with resistive/capacitive (RC) networks.

In FIG. 1, an input Vin is provided to a 7th-order continuous-time filter block 100. 7th-order continuous-time filter block 100 comprises amplifiers Ai 101 and Ao 111, several second order filter sections, a first-order gain stage 109 and a Fc bias generator. The input Vin is coupled to node 117, which is coupled to amplifier Ai 101. Amplifier Ai 101 provides an output to the filter sections through node 119. In the filter sections, three biquadratic filters 103, 105, and 107 and first-order gain stage 109 are cascaded to implement the filter transfer function. Biquad1 103 is coupled to node 121, which is coupled to biquad2 105. The output of biquad2 105 is taken at node 123, which is coupled to biquad3 107. The output of biquad3 107 is coupled to node 125, which is coupled to first-order section 109. Since the biquadratic filters are comprised of integrators made up of capacitors and transconductance amplifiers in feedback, the frequency parameters are set by the RC products, or equivalently, by the $g_m/C$ ratios of the transconductance amplifiers in a first approximation. The $g_m/C$ ratio of the OTA's can be tuned with a control voltage so that the cutoff frequency (Fc) of the filter can be varied with a simple Digital-to-Analog Converter (DAC) 115 as shown in FIG. 1. At the output stage, the output of the first order gain stage of the filter sections is coupled to node 127, which is coupled to amplifier Ao 111. The output of the amplifier Ao 111 is coupled to $V_{out}$ through node 129. The filter sections of biquadratic 103, 105, 107 and the first order gain stage 109 are coupled to node 131, which is coupled to Fc bias generator 113. Fc bias generator 113 is coupled to node 133, which is coupled to Fc DAC 115. Fc DAC 115 is also coupled to a data bus.

To calibrate the cutoff frequency (Fc) of the filter of the type in FIG. 1, the self-tuning control circuit of the present invention compares the phase of the actual filter output with the phase of the input, and applies the appropriate correction signal until a 180° phase difference is realized. Since the group delay, and hence the phase shift, of a filter are predictable and closely related to its Fc, all cutoff frequencies can be correlated to the −180° phase point of a reference signal injected at the filter input. This relationship can be seen by evaluating the transfer function of the filter in question at the −180° phase point. For the example of a linear-phase 0.05° equiripple implementation of the 7th-order CT filter shown in FIG. 1, the normalized transfer function can be written as $$F(s) = \frac{1.31703}{s^2 + 1.68495s + 1.31703} \cdot \qquad (1)$$
$$\frac{2.95139}{s^2 + 1.54203s + 2.95139} \cdot \frac{5.37034}{s^2 + 1.14558s + 5.37034} \cdot \frac{0.86133}{s + 0.86133}$$

where $s = \omega/\omega_c$.

In addition, from basic trigonometry we find that the phase angle of the transfer function can be calculated to be equal to $$\angle F(s) = -\tan^{-1}\frac{1.68495s}{1.31703 - s^2} - \qquad (2)$$
$$\tan^{-1}\frac{1.54203s}{2.95139 - s^2} - \tan^{-1}\frac{1.14558s}{5.37034 - s^2} - \tan^{-1}\frac{s}{0.86133}$$

Solving the above equation when $s=\omega/\omega_c=1$, we see that at the cutoff frequency of the filter ($\omega_c$) the $\angle F(s)=-181.61°$. Similarly, when we set Equation (2) to be equal to −180.00° and solve for $\omega$, we find that $\omega=0.9911\omega_c$. Thus, it is seen that for a linear-phase filter of this type, the deviation of the cutoff frequency with respect to the −180° phase point is only −0.89%. For other filter configurations similar results can be obtained, producing frequency deviations which may range over several percent. However, the amount of deviation is not important, since a user can effectively null any frequency offsets by altering the $F_c$ DAC value as required by the application.

Figure 2A:
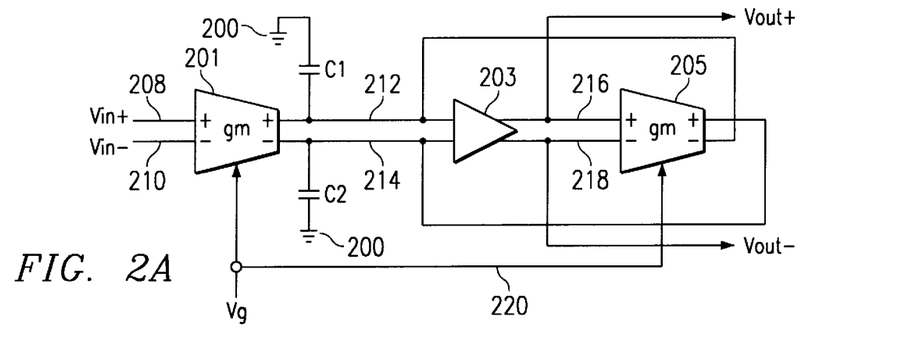
FIG. 2A is a block diagram of a first-order $g_m$-C low-pass circuit.
Figure 2B:
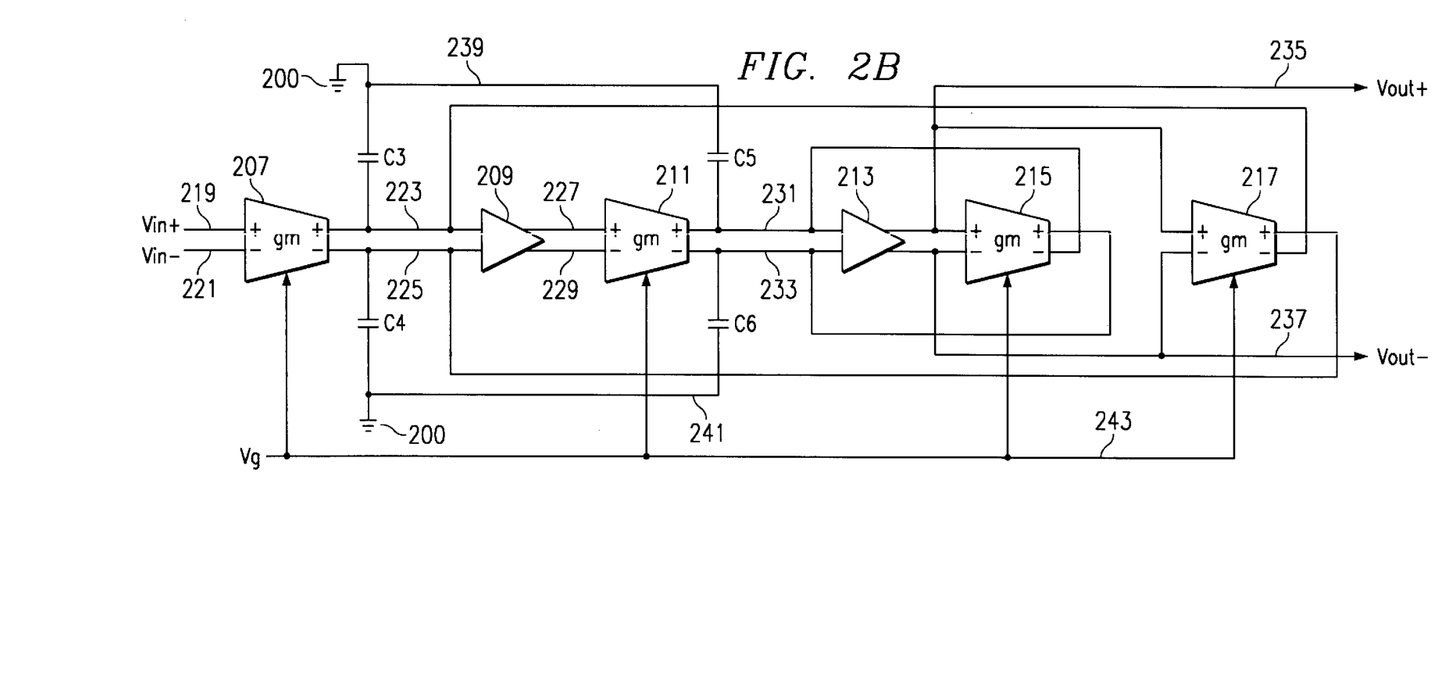
FIG. 2B is a block diagram of a biquadratic $g_m$-C low-pass circuit.

Examples of first and second-order $g_m$-C transconductance stages are shown in FIGS. 2A and 2B, where fully differential OTA's and capacitors are connected in low-pass configurations, tunable with a control voltage $V_g$. FIG. 2A illustrates a first order $g_m$-C transconductance stage where differential inputs Vin+ and Vin− are coupled to nodes 208 and 210 respectively. Nodes 208 and 210 are coupled to positive and negative input ports of a transconductance amplifier 201 respectively. The positive output port of the transconductance amplifier 201 is coupled to node 212, which is coupled to capacitor C1, the positive input port of buffer 203, and the negative output port of transconductance amplifier 205. The negative output port of the transconductance amplifier 201 is coupled to node 214, which is coupled to capacitor C2, the negative input port of buffer 203, and the positive output port of transconductance amplifier 205. Capacitors C1 and C2 are coupled to a stable reference node 200, in this particular implementation a ground. The positive and negative output ports of buffer 203 are coupled to nodes 216 and 218 respectively. Nodes 216 and 218 are coupled to the positive and negative input ports, respectively, of transconductance amplifier 205. Nodes 216 and 218 are also coupled to the lowpass output ports (Vout+ and Vout−) of the first-order filter. Control voltage $V_g$ is fed to the transconductance amplifiers 201 and 205 through node 220 for tuning purposes.

FIG. 2B illustrates a second-order $g_m$-C transconductance stage. Differential inputs Vin+ and Vin− are coupled to nodes 219 and 221 respectively. Nodes 219 and 221 are coupled to a transconductance amplifier 207. The positive output port of the transconductance amplifier 207 is taken at node 223, which is coupled to capacitor C3, the positive input port of buffer 209, and the negative output port of a transconductance amplifier 217. The negative output port of the transconductance amplifier 207 is taken at node 225, which is coupled to capacitor C4, the negative input port of buffer 209, and the positive output port of the transconductance amplifier 217. The positive and negative output ports of buffer 209 are coupled to nodes 227 and 229 respectively. Nodes 227 and 229 are coupled to the positive and negative input ports, respectively, of transconductance amplifier 211. The positive output port of a transconductance amplifier 211 is coupled node 231, which is coupled to capacitor C5, the positive input port of buffer 213, and the negative output port of a transconductance amplifier 215. The negative output port of the transconductance amplifier 211 is coupled node 233, which is coupled to capacitor C6, the negative input port of buffer 213, and the positive output port of the transconductance amplifier 215. Capacitors C3–C6 are coupled to a stable reference node 200, for example a ground. The positive output port of buffer 213 is coupled to node 235, which is coupled to the positive input ports of the transconductance amplifiers 215 and 217. The negative output port of buffer 213 is coupled to node 237, which is coupled to the negative input ports of transconductance amplifiers 215 and 217. Control voltage $V_g$ is fed to the transconductance amplifiers 207, 211, 215, and 217 through node 243 for tuning purposes. Nodes 235 and 237 are coupled to the lowpass output ports (Vout+ and Vout– respectively) of the second-order filter.

In the low-pass circuit of FIG. 2B, buffers 209 and 213 represent unity-gain buffers used for level shifting and biasing purposes. Capacitors C3–C6 all have a capacitance value of C in this example. Transconductance amplifiers 207, 211, 215, and 217 are voltage-in current-out amplifiers with gain $g_m$. The capacitors can be considered as current-in voltage-out devices with impedance of 1/sC.

Figure 4:
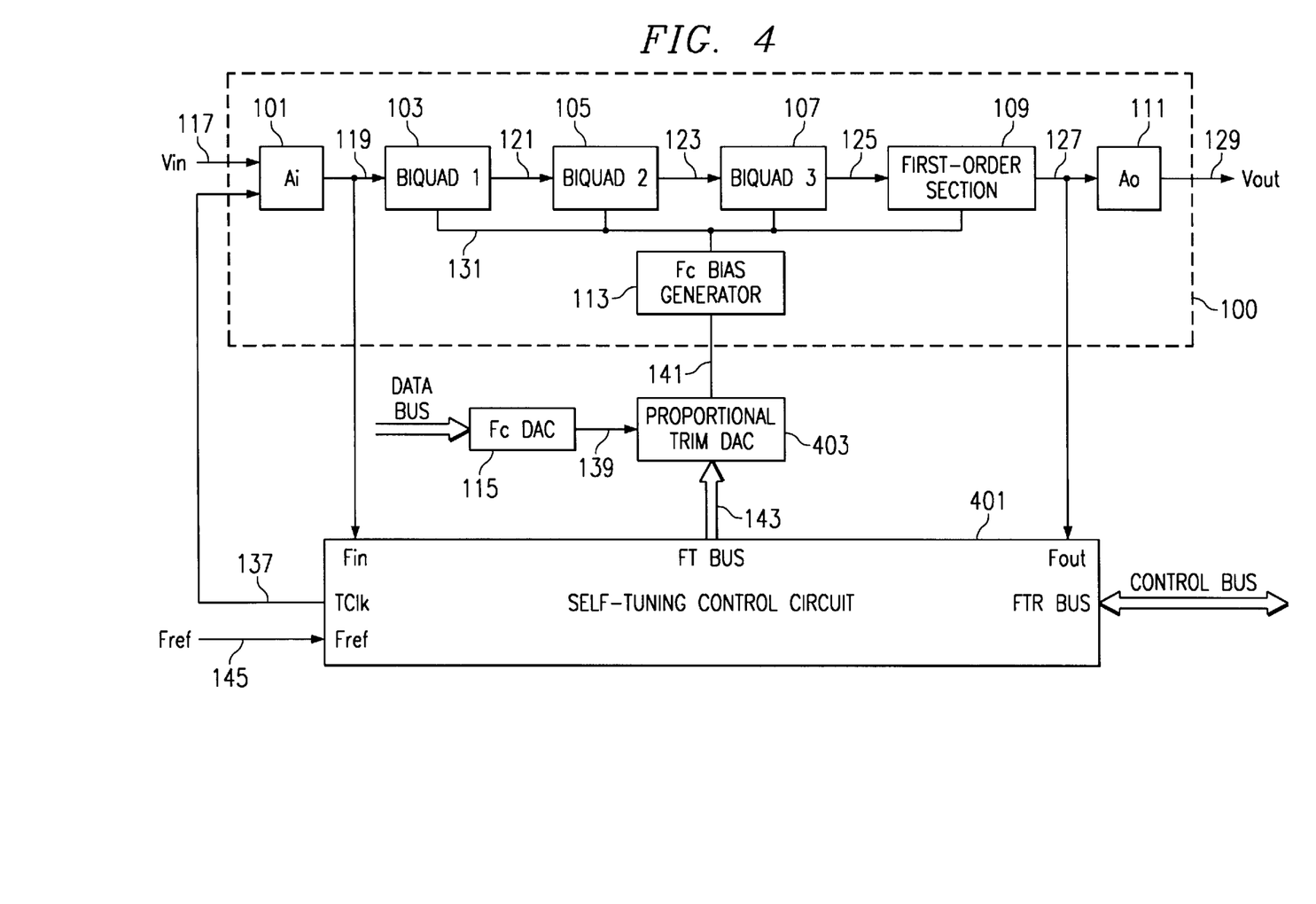
FIG. 4 is a block diagram of an embodiment of the self-tuning control circuit of the present invention as applied to an integrated continuous time filter.

FIG. 4 illustrates a block diagram of a self-tuning control system wherein the present invention is applied to a 7th-order CT integrated filter, similar to the filter of FIG. 1. To create a reference frequency signal for injection at the filter input, the self-tuning control circuit utilizes a clock signal $F_{ref}$, from which a triangle wave is generated at the desired tuning frequency and outputted at TClk. $F_{ref}$ is also used to clock all the internal sequential timing circuits of the system in FIG. 4, and can be derived from any stable frequency source available to a user. The filter input stage $A_i$ in FIG. 4 has been reconfigured so that the TClk reference signal can be multiplexed at the time of calibration with the normal filter input $V_{in}$. Also node 119 is coupled to Fin input of self-tuning control circuit 401 as well as to biquad1 103. Node 127 is coupled to $F_{out}$ input of self-tuning control circuit 401 as well as to Ao 111. $F_c$ DAC 115 is now coupled to node 139, which is coupled to proportional trim DAC 403. Proportional trim DAC 403 is coupled to bus 143 and to node 141, which is coupled to Fc bias generator 113.

In FIG. 4, self-tuning control circuit block 401 takes $F_{ref}$ as input at node 145 and outputs TClk to 7th-order CT integrated filter block 100 through node 137. Self-tuning control block 401 is coupled to a control bus and to proportional trim DAC 403 through bus 143. To determine the phase relationship of the filter output with respect to the reference signal, the self-tuning control circuit monitors node 127 of filter 100 at $F_{out}$ and node 119 of the filter at $F_{in}$. Once a self-tuning cycle has been initiated through the FTR control bus, the self-tuning control circuit increments or decrements the digital value of the FT Bus as required to produce a 180° phase shift between $F_{out}$ and $F_{in}$. The filter trim is accomplished by connecting the FT Bus to proportional trim DAC 403 that is placed between $F_c$ DAC 115 and $F_c$ bias generator 113 of filter 100. The filter phase, and hence the cutoff frequency, is effectively trimmed by proportional trim DAC 403 which scales the $F_c$ DAC 115 current in proportion to its magnitude by the equation $I_{out}=F_t \cdot I_{in}$, where $I_{in}$ is the $F_c$ DAC current and $F_t$ is the proportional trim factor. For most applications $1.30 \geq F_t \geq 0.70$ provides sufficient range to compensate for typical process variations, with the value $F_t=1.0$ set by the midpoint value of the FT Bus, i.e., 64 for a 7-bit bus width. The FTR Bus is also used to signal the completion of the self-tuning cycle to a user, as well as an End-Of-Range (EOR) detection for an internal up/down counter.

Figure 5:
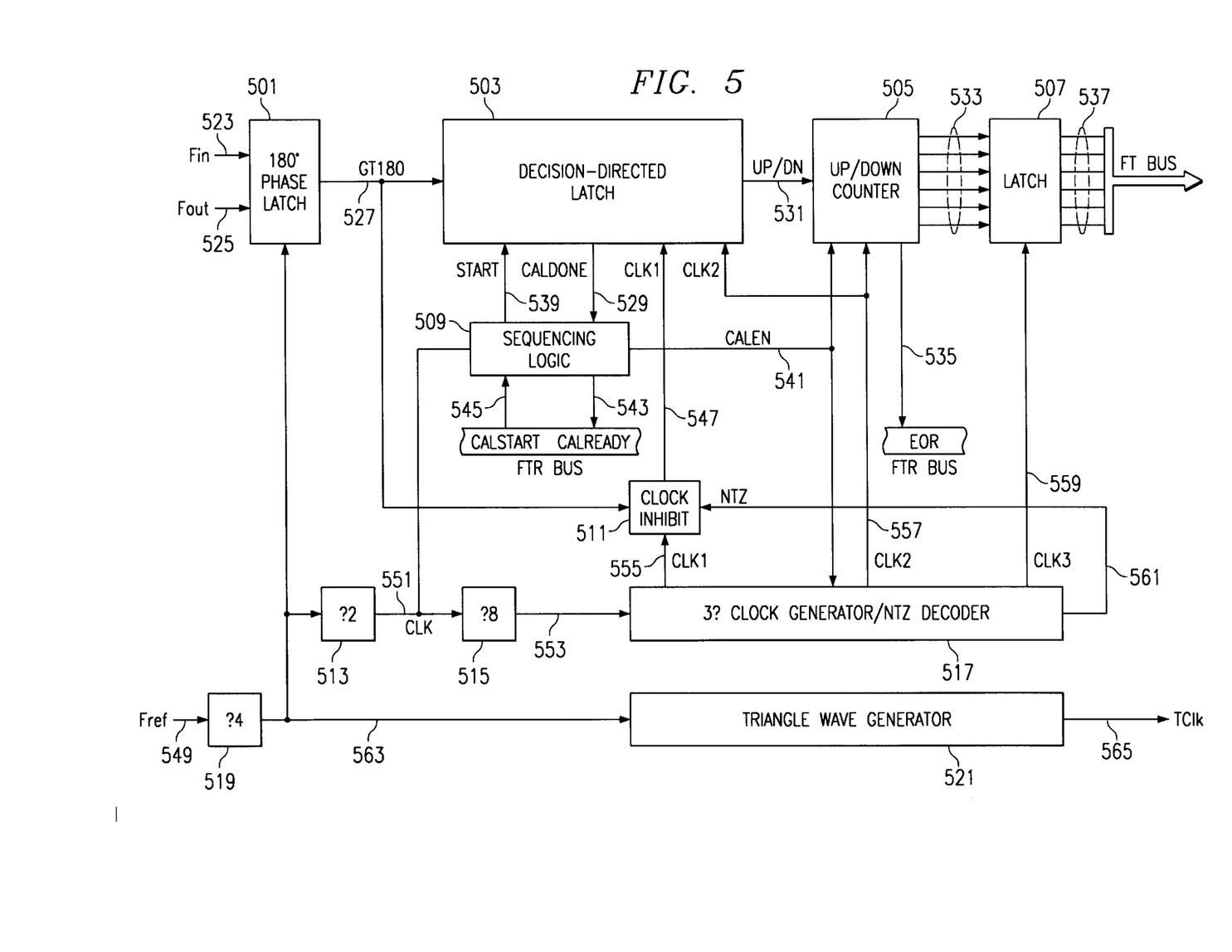
FIG. 5 is a block diagram of the preferred embodiment of the present invention.

Describing the operation of the invention in more detail, a comprehensive block diagram of the preferred embodiment is shown in FIG. 5. The filter input and output, denoted by $F_{in}$ and $F_{out}$, respectively, are coupled to nodes 523 and 525 respectively. Nodes 523 and 525 are coupled to inputs of 180° phase latch 501 which compares $F_{in}$ and $F_{out}$ signals to determine whether the phase of $F_{out}$ is greater or less than –180° with respect to $F_{in}$. If a greater-than condition is detected, 180° phase latch 501 asserts a logic '1' at the GT180 output which is coupled to node 527. Node 527 is coupled to a decision-directed latch 503 and clock inhibit block 511. Phase latch 501 must be able to accurately detect and latch the –180° phase point regardless of signal offsets and logic delay parasitics. One suitable phase latch is described in Applicant's copending Patent Application filed Feb. 22, 1995, assigned to Assignee of the present application and entitled "Precision (nπ)/2 Latching Phase Detector," incorporated herein by reference.

Figure 9:
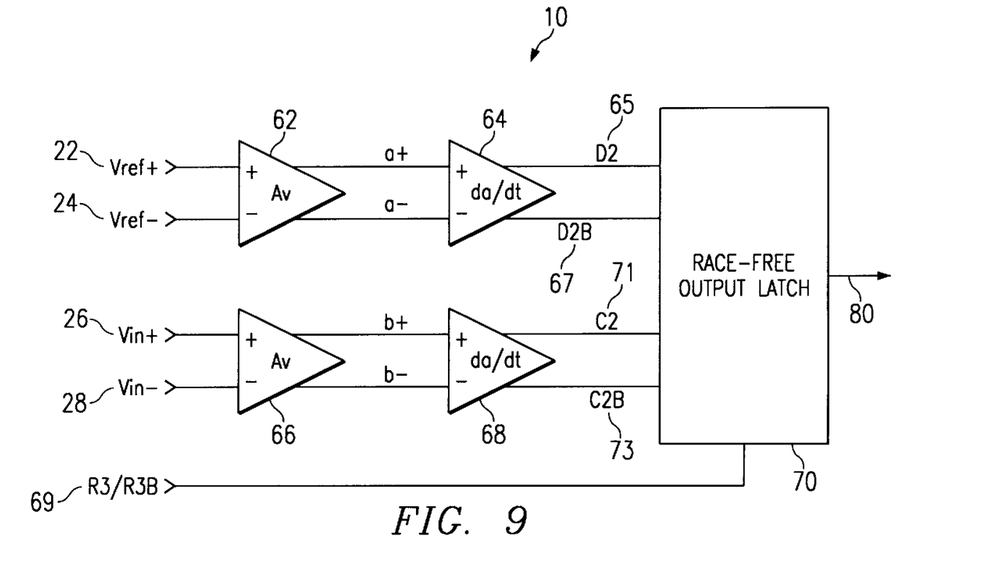
FIG. 9 shows a block diagram of the nπ/2 latching phase detector where n=2.

FIG. 9 shows a block diagram of the preferred embodiment of the precision latching phase detector 10 as an example of 180° phase latch. In the embodiment shown in FIG. 9, variable n is equal to 2. Accordingly, phase detector 10 detects whether the phase difference between a reference signal and an input signal is greater or less than 180 degrees. Both the reference signal and the input signal to phase detector 10 are differential signals. A reference signal (Vref) is converted to differential form (i.e., Vref+ and Vref–) in a manner well known in the art. Likewise, an input signal (Vin) is converted to differential form (i.e., Vin+ and Vin–) in a manner well known in the art. For example, Fin 523 and Fout 525 can be converted to differential signals and fed to phase detector 10. The circuit necessary for these conversions is not shown to preserve simplicity.

Differential reference signals Vref+ (22) and Vref– (24) are amplified by differential amplifier 62. Differential amplifier 62 provides signals with magnitudes large enough to ensure adequate input levels for reference signal differentiator 64 (also referred to as the "reference differentiator"). The gain of differential amplifier 62 can be adjusted by a user as desired. Reference signal differentiator 64 typically includes a high pass filter. The proper setting of the corner frequency of the high pass filter results in elimination of DC or low frequency offset component of the reference signal. Reference signal differentiator 64 also converts analog reference signals Vref+ and Vref– to digital output signals D2 (65) and D2B (67), respectively.

In a similar manner, differential input signals Vin+ (26) and Vin– (28) are amplified by differential amplifier 66. Differential amplifier 66 provides signals with magnitudes large enough to ensure adequate input levels for input signal differentiator 68 (also referred to as the "input differentiator"). The gain of differential amplifier 66 can be adjusted as desired. As with reference signal differentiator 64, input signal differentiator 68 includes a high pass filter. The proper setting of the corner frequency of the high pass filter eliminates DC or low frequency offset component of the input signal. Input signal differentiator 68 also converts analog input signals Vin+ and Vin– to digital output signals C2 (71) and C2B (73), respectively. The output of phase detector 10 is output 80 of output latch 70. Output 80 indicates whether the phase difference between Vref+ and Vin+ (or between Vref− and Vin−) is greater or less than 180 degrees. Output latch 70 is a "race-free" latch and, as such, output latch 70 eliminates race and metastable conditions that result in phase shifts.

Figure 10:
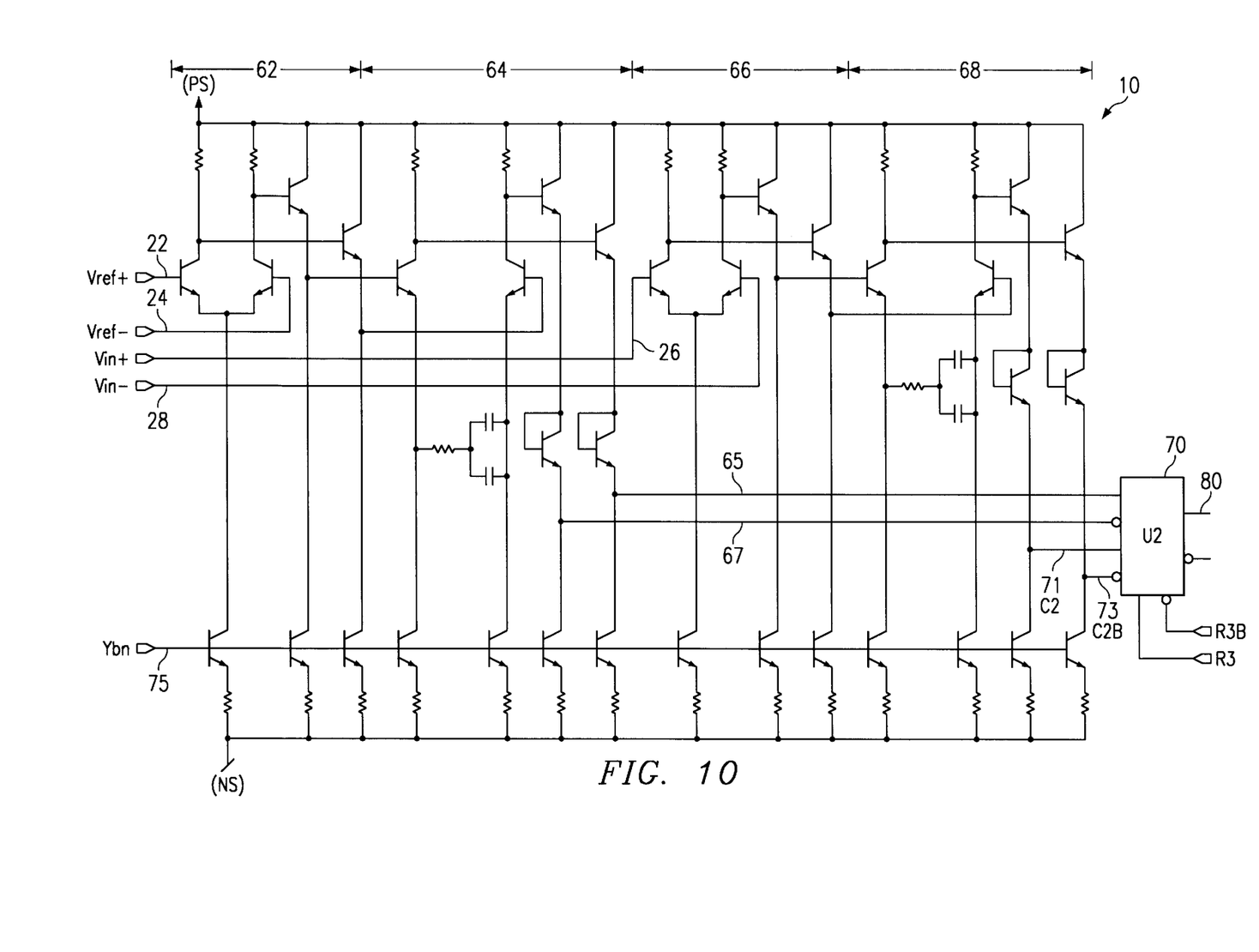
FIG. 10 is a detailed illustration of an implementation of reference signal and input signal differentiators.
Figure 11:
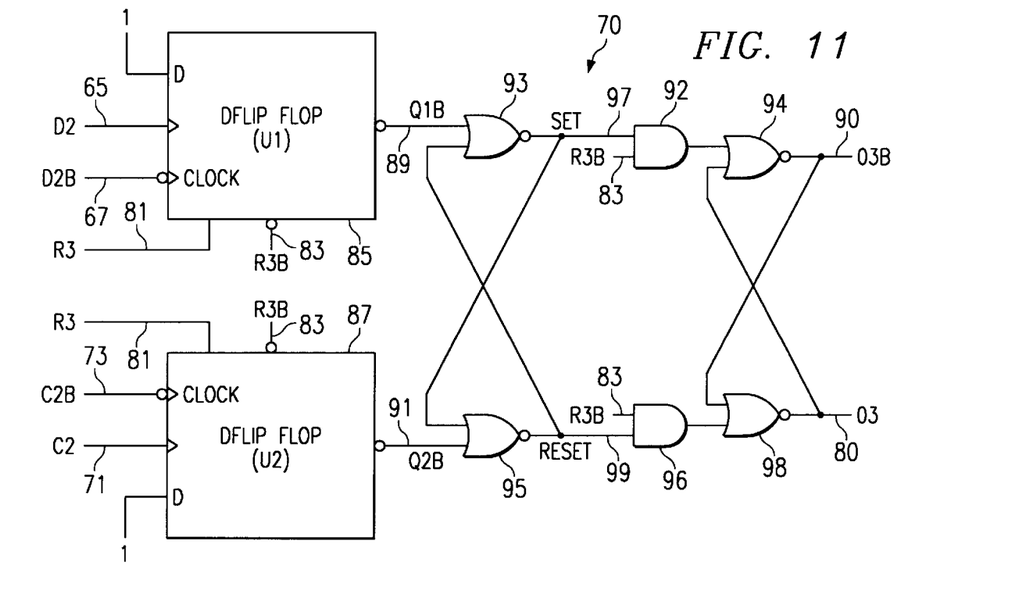
FIG. 11 illustrates an output latch of the phase detector of FIG. 9.

FIG. 10 is an example of detailed implementation of differential amplifiers 62 and 66, and differentiators 64 and 68 in ECL (Emitter Coupled Logic). Output latch 70 is still shown in block diagram (the detailed implementation of output latch 70 is shown in FIG. 11). Referring to FIG. 10, reference signals Vref+ (22) and Vref− (24) are provided to differential amplifier 62. As shown, differential amplifier 62 comprises transistors Q28 through Q34 and resistors R20 through R24. Transistors Q34 through Q32, and resistors R22 through R24 provide a differential ECL amplifier as is well known in the art. Transistors Q28 through Q31 and resistors R21 and R20 provide a low impedance emitter follower output, also well known in the art. A bias voltage Vbn (75) is provided to bias transistors Q33, Q31, and Q29 as shown in FIG. 10.

The differential output of differential amplifier 62 is coupled to reference signal differentiator 64 as shown in FIG. 10. Reference signal differentiator 64 comprises transistors Q18 through Q27, and resistors R19 through R13. Transistor Q24 and resistor R15 determine the gain of the differentiator at output D2B (67), while transistor Q26 and resistor R18 determine the gain of differentiator at output D2 (65). Transistor Q21 provides a low impedance emitter follower output. The output of transistor Q21 undergoes a diode voltage drop through transistor Q22. This diode drop properly sets the voltage level of output D2B (67) before being fed to output latch 70. With respect to output D2 (65), transistor Q18 provides a low impedance emitter follower output. The output of transistor Q18 undergoes a diode drop in voltage through transistor Q19. This diode drop properly sets the voltage level of output D2 (65) before being fed to output latch 70. Differentiator 64 behaves as a high-pass filter with a "corner frequency" below which the gain of differentiator 64 (either at output D2B or D2) drops to a very low value. The "RC" circuit comprising R17, C3, and C4 determines this corner frequency of reference signal differentiator 64. Transistors Q27, Q25, Q23, and Q20, and resistors R19, R16, R14, and R13 provide the proper bias condition for reference signal differentiator 64. Bias voltage Vbn (75) provides the proper bias for transistors Q27, Q25, Q23, and Q20 as shown in FIG. 10.

Input signals Vin+ (26) and Vin− (28) are provided to differential amplifier 66. As shown, differential amplifier 66 comprises transistors Q11 through Q17 and resistors R8 through R12. Transistors Q15 through Q17, and resistors R20 through R12 provide a differential ECL amplifier as is well known in the art. Transistors Q11 through Q14 and resistors R8 and R9 provide a low impedance emitter follower output, also well known in the art. Bias voltage Vbn (75) is used to bias transistors Q16, Q14, and Q12 for proper operation.

The differential output of differential amplifier 66 is coupled to input signal differentiator 68 as shown in FIG. 10. Reference signal differentiator 68 comprises transistors Q1 through Q10, and resistors R1 through R7. Transistor Q7 and resistor R3 determine the gain of the differentiator at output C2 (71), while transistor Q9 and resistor R6 determine the gain of differentiator at output C2B (73). Transistor Q4 provides a low impedance emitter follower output. The output of transistor Q4 undergoes a diode voltage drop through transistor Q5. This diode drop properly sets the voltage level of output C2 (71) before being fed to output latch 70. With respect to output C2B (73), transistor Q1 provides a low impedance emitter follower output. The output of transistor Q1 undergoes a diode drop in voltage through transistor Q2. This diode drop properly sets the voltage level of output C2B (73) before being fed to output latch 70. Differentiator 68 behaves as a high-pass filter with a "corner frequency" below which the gain of differentiator 68 (either at output C2B or C2) drops to a very low value. The "RC" circuit comprising R5, C1, and C2 determines this corner frequency of reference signal differentiator 68. Transistors Q10, Q8, Q6, and Q3, and resistors R7, R4, R2, and R1 provide the proper bias condition for reference signal differentiator 68. Bias voltage Vbn (75) provides the proper bias for transistors Q10, Q8, Q6, and Q3 as shown in FIG. 10.

From basic circuit theory it can be shown that the transfer function for the reference signal path is:

$$F_{ref}(s) = A_v(s) \cdot A_{diff}(s) \tag{3}$$

where
$A_v(s)$ = gain of differential amplifier 62

$$= -g_{gQ34} R_{24} \tag{4}$$

and $A_{diff}(s)$ = gain of reference signal differentiator 64

$$= g_{m_{Q24}} R15 / [1 + g_{m_{Q24}}(sR_{17}C_a + 1)/2sC_a] \tag{5}$$

where $C_a = C_3 + C_4$.

Substituting for $A_v(s)$ and $A_{diff}(s)$, equation (3) can now be expressed as:

$$F_{ref}(s) = 2g_{m_{Q34}} R_{24}(sR_{15}C_a) / [sC_a(R_{17} + 2/g_{m_{Q24}}) + 1] \tag{6}$$

Since transconductance $g_{m_{Q24}}$ of transistor Q24 is very large, $2/g_{m_{Q24}}$ is negligible as compared with R17. Accordingly, from the transfer function shown in equation (6), we can see that the "corner frequency" of reference signal differentiator 64 can be approximated as:

$$f_a = \tfrac{1}{2}\pi R_{17} C_a \tag{7}$$

In like manner, the transfer function for the input signal path is equal to:

$$F_{in}(s) = 2g_{m_{Q17}} R_{12}(sR_3 C_b) / [sC_b(R_5 + 2/g_{m_{Q7}}) + 1] \tag{8}$$

where $C_b = C_1 + C_2$.

Since transconductance $g_{m_{Q7}}$ of transistor Q7 is very large, $2/g_{m_{Q7}}$ is negligible as compared with R5. Accordingly, from the transfer function shown in equation (8), we can see that the "corner frequency" of input signal differentiator 68 can be approximated as:

$$f_b = \tfrac{1}{2}\pi R_5 C_b \tag{9}$$

The transfer functions for both the reference signal path (i.e., $F_{ref}(s)$) and the input signal path (i.e., $F_{in}(s)$) are transfer functions for a "high-pass" filter. Accordingly, the "corner frequency" ($f_a = \tfrac{1}{2}R_{17}C_a$) of reference signal differentiator 64 is a frequency below which the gain of differentiator 64 is very small. Thus, signals with frequencies below $f_a = \tfrac{1}{2}R_{17}C_a$ are suppressed, and only signals above the corner frequency $f_a = \tfrac{1}{2}R_{17}C_a$ pass through reference signal differentiator 64. Likewise, the corner frequency ($f_b = \tfrac{1}{2}R_5 C_b$) of input signal differentiator 68 is a frequency below which the gain of differentiator 68 is very small. Thus, signals with frequencies below $f_b = \tfrac{1}{2}R_5 C_b$ are suppressed, and only signals above the corner frequency $f_b = \tfrac{1}{2}R_5 C_b$ pass through input signal differentiator 68.

In the case of a 180 degree phase detector (shown in FIG. 10), the high-pass corner frequency of both differentiator 64 and differentiator 68 is set below the reference and input signal frequencies. This is done so that the frequencies of interest pass through the differentiators' high pass filters. However, the high pass corner frequency is set high enough such that DC and low frequency offsets present in reference signal (Vref+ or Vref−) or input signal (Vin+ or Vin−) are suppressed. Thus, signals D2, D2B, C2 and C2B provided to output latch 70 do not contain a DC or low frequency offset component. Accordingly, the phase relationship between the reference signal (Vref+ or Vref−) and input signal (Vin+ or Vin−) is accurately measured. The corner frequencies ($f_a = \frac{1}{2}\pi R_{17} C_a$ and $f_b = \frac{1}{2} R_5 C_b$) are adjusted to desired values by simply adjusting the values of capacitors $C_a$ (i.e., C3+C4) and $C_b$ (i.e., C1+C2).

Output latch 70 is shown in detail in FIG. 11. Signals D2B (67) and D2 (65) are provided to D flipflop 85, while signals C2B (73) and C2 (71) are provided to D flipflop 87 as shown. The flipflops as embodied in FIG. 11 have differential clock and reset inputs. Differential flipflops are preferred due to good noise immunity. However, those skilled in the art recognize that single input flipflops can be used instead of the differential flipflops. Reset signals R3 (81) and R3B (83) are also coupled to both D flipflop 85 and D flipflop 87. Output 89 (Q1B) of D flipflop 85 is coupled to NOR gate 93. Similarly, output 91 (Q2B) of D flipflop 87 is coupled to NOR gate 95. D flipflop 85 and D flipflop 87 are configured such that the D inputs are connected to logic "One." Accordingly, the output of the flipflops will change dependent upon the state of the reset inputs R3 and R3B when the C2 input transitions from low to high and C2B from high to low. For example, output Q1B (89) of D flipflop 85 is set low when D2 transitions from low to high and reset (R3) is low.

NOR gate 93 and NOR gate 95 are cross-coupled as shown in FIG. 11. Output 97 (Set) of NOR gate 93 is coupled to AND gate 92, while output 99 (Reset) of NOR gate 95 is coupled to AND gate 96. A second input to AND gate 92 is R3B (83), while a second input to AND gate 96 is also R3B (83). The output of AND gate 92 is coupled to NOR gate 94, while the output of AND gate 96 is connected to NOR gate 98. NOR gate 94 and NOR gate 98 are cross-coupled as shown. Either output 90 (O3B) of NOR gate 94 or output 80 (O3) of NOR gate 98 can be used as output of latch 70. Output of latch 70 (either O3 or O3B) is also output of phase detector 10.

In operation, a positive transition of reference signal D2 will set D flipflop 85, whose state will remain unchanged until the reset signal R3 is asserted high. Likewise, a positive transition of input signal C2 will set D flipflop 87 which will remain in that state until the reset signal R3 is asserted high. In one implementation of this embodiment, reset signal R3 is asserted high 90 degrees after a positive transition of the reference signal D2 (or D2B).

Now referring back to FIG. 5, decision-directed latch 503 also receives START signal from sequencing logic 509 and supplies a CALDONE signal to sequencing logic block 509. Based upon the information at GT180, decision-directed latch 503 provides an appropriate UP/DN signal 531 to up/down counter 505 so that up/down counter 505 can be clocked in the direction necessary to eliminate the phase error. The proper control of the tuning direction is achieved with decision-directed latch 503 and sequencing logic block 509 as shown in FIG. 5. Decision-directed latch 503 also performs the basic function of latching the state of the GT180 signal at the beginning of the self-tuning cycle and detecting a polarity reversal of GT 180, indicating that the −180° phase point has been reached.

The reference frequency clock signal $F_{ref}$ is fed to divider block 519 through node 549 and divided by divider block 519 to obtain the desired reference frequency for tuning, and converted to an analog waveform by triangle wave generator (TWG) 521 which provides an output TClk through node 565. TWG 521 is used to produce an analog signal which contains low harmonic content. However, a digital-to-sine conversion or any other suitable low-harmonic wave generator can be used instead of the TWG as the designer deems appropriate. The output of block 519 is taken at node 563, which is coupled to blocks 501, 513 and 521. The $F_{ref}$ signal is also used to clock the sequential logic circuits of the invention after an additional divide-by-2 stage 513. The output of block 513 is taken at node 551, which is coupled to blocks 509 and 515. $F_{ref}$ signal after stage 513 drives a modulo-8 Johnson counter 515 used to generate the update frequency of the invention, and provides a synchronization clock required by sequencing logic block 509.

The exact modulus of the frequency dividers can be altered to accommodate different design requirements to provide the desired frequency of operation based upon the available frequency source. In the example of FIG. 5, for an $F_{ref}$ frequency of 32 MHz the filter self-tuning frequency will be equal to 8 MHz, with updates to the FT Bus occurring every $2\mu S$. The update rate of the invention should be selected by a user to allow sufficient time for the filter to respond to the modified DAC current. The output of block 515 is coupled to node 553, which is coupled to three-phase clock generator/NTZ decoder 517. Three-phase clock generator/NTZ decoder 517 provides CLK2 signal through node 557 to up/down counter 505 and CLK3 signal through node 559 to latch 507. Node 557 is also coupled to decision-directed latch 503. Three-phase clock generator/NTZ decoder 517 also provides signal CLK1 through node 555 and signal NTZ through node 561 to clock inhibit block 511.

Sequencing logic block 509 provides CALEN signal through node 541 to Up/down counter 505 and three-phase clock generator/NTZ decoder 517. Sequencing logic block 509 also provides START signal to decision-directed latch 503 through node 539 and CALREADY signal to FTR Bus through node 543. Sequencing logic block 509 receives CALSTART signal through node 545 which is coupled to FTR Bus.

Up/down counter 505 supplies EOR signal through node 535 to the FTR Bus and data through bus 533 to latch 507. Latch 507 is coupled to the FT Bus through bus 537. A flow diagram of latch 503 is shown in FIG. 6 where its operation is detailed for an illustrative self-tuning cycle.

Figure 6:
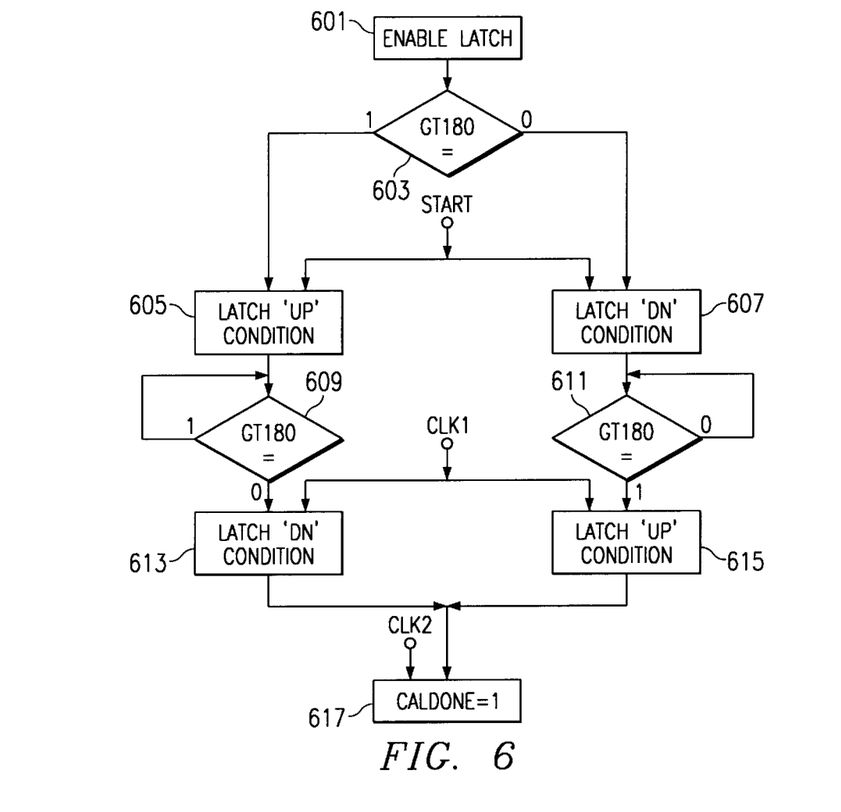
FIG. 6 is a flow diagram of the decision-directed latch of the preferred embodiment of the present invention.

Referring to FIG. 6, when latch 503 is first enabled in block 601, latch 503 tests the state of the GT180 signal in block 603. Then, the state of the GT180 signal is transferred to the output upon the assertion of the START pulse in blocks 605 and 607. Latch 503 remains in this condition until the polarity of GT180 reverses in blocks 609 or 611. When latch 503 is clocked by the CLK1 pulse, it changes state in blocks 613 or 615. The first assertion of CLK2 following this sequence then asserts the CALDONE signal to a logic '1' in block 617 to terminate the self-tuning cycle.

Sequencing logic block 509 of FIG. 5 synchronizes the START pulse with the internal reference-based CLK signal after the receipt of the CALSTART pulse to begin a self-tuning cycle. The rising edge of the START pulse then initiates the self-tuning cycle and is coincident with the first CLK1 rising edge. Once the self-tuning cycle has been initiated, the three-phase clock generator 517 is enabled to produce the three clock signals CLK1, CLK2 and CLK3 required by this embodiment. The state of GT180 is latched on the rising edge of CLK1. The up/down counter 505 is clocked on the rising edge of CLK2, and the contents of the 7-bit latch 507 is transferred onto the FT Bus on the rising edge of CLK3.

The preferred embodiment of FIG. 5 also provides clock inhibit block 511 to prevent the premature termination of a self-tuning cycle due to the false transitioning of the GT180 signal caused by noise. Clock inhibit block 511 provides CLK1 signal to decision-directed latch 503 through node 547. Clock inhibit block 511 effectively inhibits the CLK1 signal during a No-Transition-Zone (NTZ) time period generated by the three-phase clock generator/NTZ decoder 517. In the embodiment of FIG. 5 the NTZ is the period of time two CLK cycles in length just prior to the rising edge of CLK1, wherein no transitions of GT180 are allowed to change the state of the Latch. The prevention of premature self-tuning cycle termination can also be done by using pulse discrimination or filtering technique to ensure the stable detection of the point so that the self-tuning cycle can be successfully terminated.

The self-tuning cycle is initiated when the sequencing logic block 509 receives a CALSTART pulse from the FTR Bus. The CALSTART pulse can be asynchronous in nature, and should be a minimum of two CLK periods in width in this embodiment. This relationship can be seen in the timing diagram of FIG. 7, where the first falling edge of CLK after receipt of the CALSTART pulse asserts CALEN to enable three-phase clock generator 517 and up/down counter 505.

Figure 7:
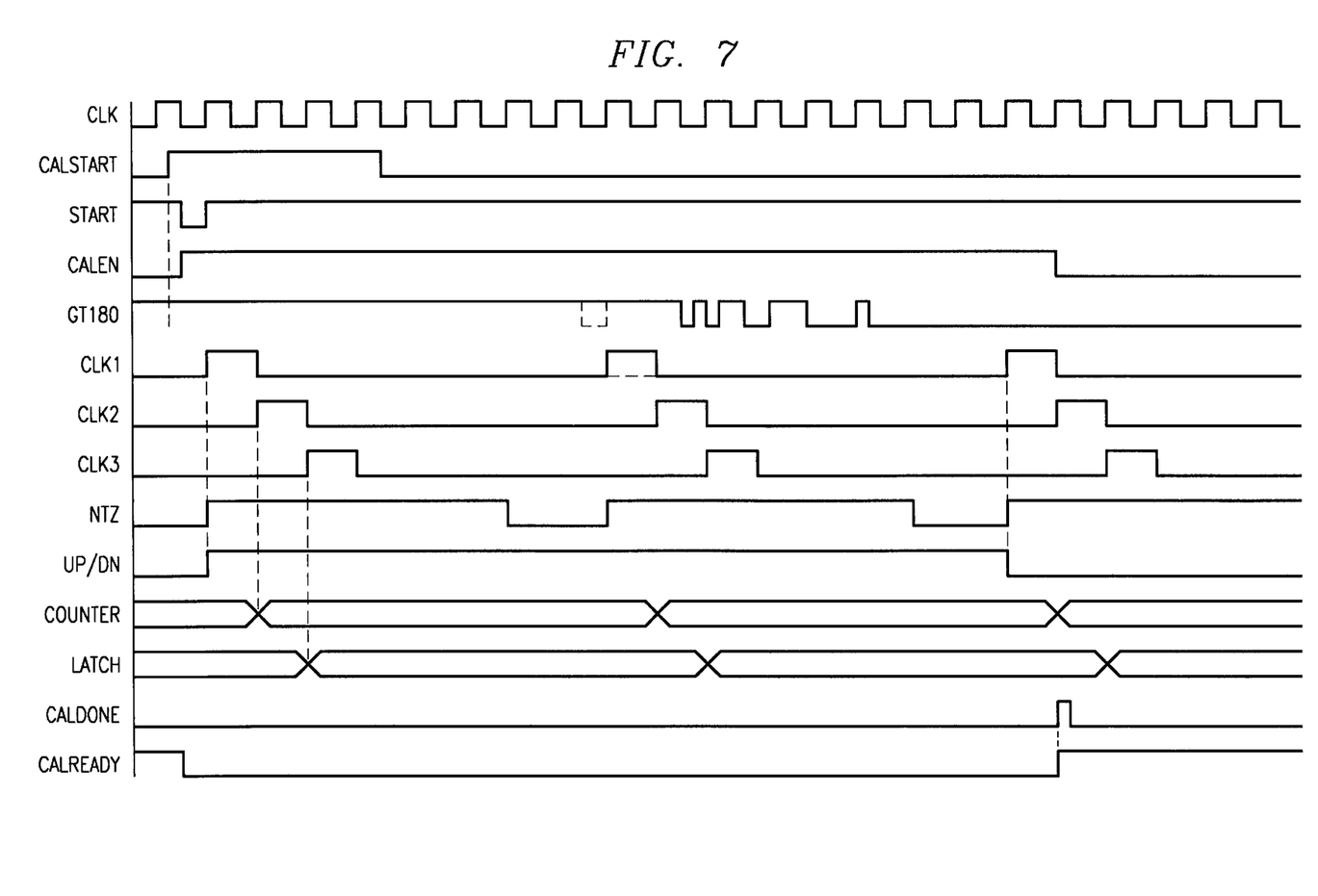
FIG. 7 illustrates the timing sequences of an embodiment of the present invention during a self-tuning cycle.

Referring now to FIG. 7, the relationship of the abovementioned signals can be seen during a shortened self-tuning cycle used only as an example. Once CALSTART pulse has been received, START signal is generated, which starts a self-tuning cycle. The state of GT180 is latched by the rising edge of CLK1, asserting UP/DN to a logic '1' indicating a count 'UP' condition. Each and every rising edge of CLK2 then increments up/down counter 505, with the resulting counter value transferred to the FT Bus by latch 507 at the rising edge of CLK3. This sequence continues until UP/DN signal is deasserted causing the assertion of CALDONE signal at the following CLK2 rising edge. The completion of the self-tuning cycle is then indicated on the FT Bus by a CALREADY signal of a logic '1' as shown. If a false transition of GT180 should occur in the No-Transition-Zone as illustrated by the dashed line of FIG. 7, the CLK1 signal will be inhibited as shown causing decision-directed latch 503 to remain in the same state until the next clock cycle. The self-tuning cycle is then properly terminated on the third clock cycle as shown in FIG. 7.

Figure 8A:
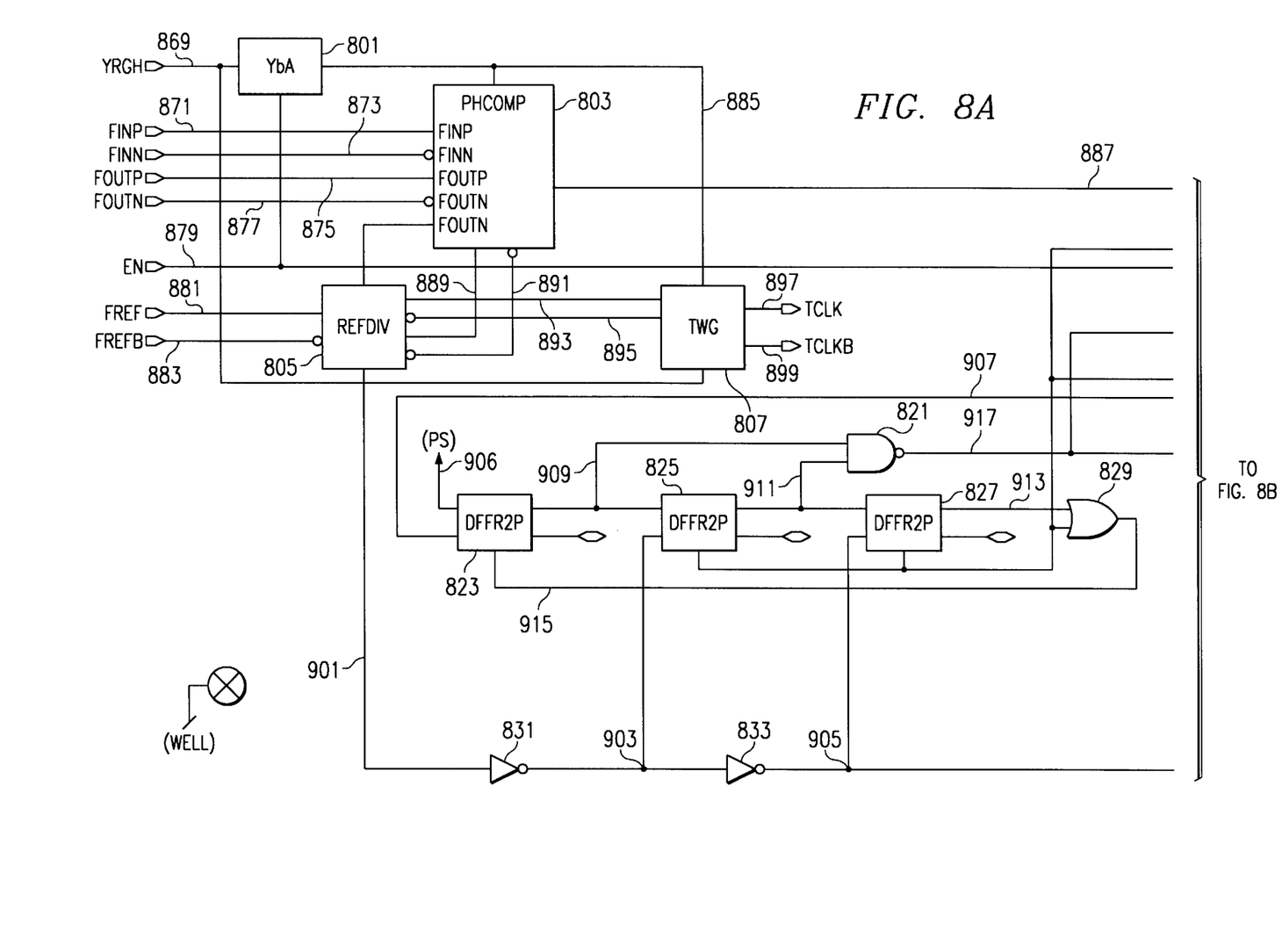
FIG. 8 is a schematic diagram of the preferred embodiment of the present invention.
Figure 8B:
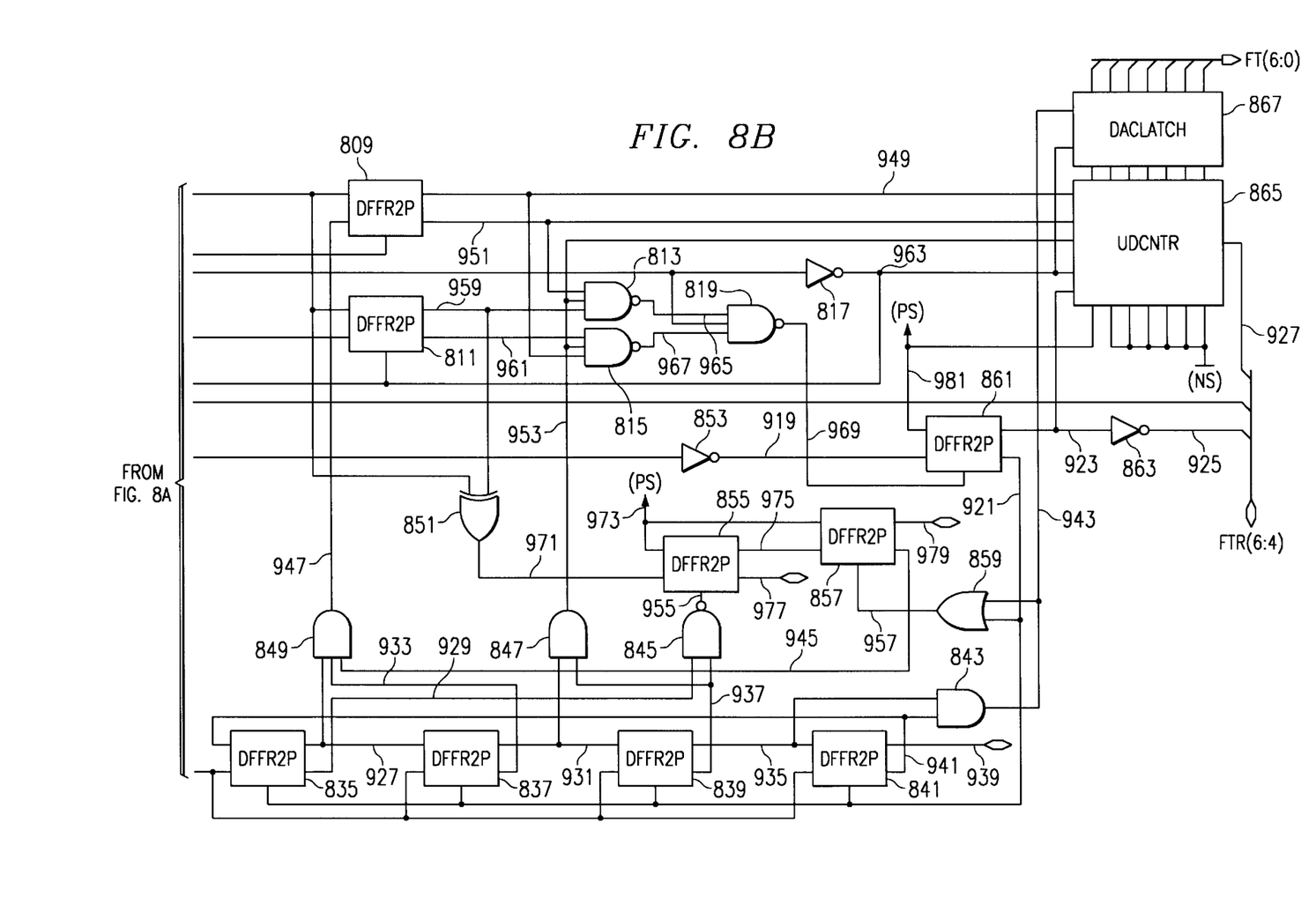

FIG. 8 illustrates the schematic diagram of the invention as one possible implementation in a BiCMOS process containing both CML (Current-Mode Logic) and CMOS (Complementary Metal Oxide Silicon) logic structures. The differential filter connections are denoted as FINP/FINN and FOUTP/FOUTN, and are coupled to nodes 871, 873 and 875, 877 respectively, which are coupled to inputs of −180° phase latch 803 named PHCOMP. Input VRGH is coupled to node 869, which is coupled to block 801 and TWG 807. The output of block 801 is taken at node 885, which is coupled to phase latch 803 and TWG 807. Phase latch 803 produces an output signal GT180 at node 887. Node 887 is coupled to EX-OR gate 851 and to flipflops 809 and 811. Decision-directed latch 503 is comprised of flipflops 809 and 811, along with gates 813, 815 and 819. Decision-directed latch 503 outputs up and down signals, through nodes 949 and 951 respectively, to up/down counter 865.

Modulo-8 Johnson counter 515 is made up of flipflops 835, 837, 839, and 841. Counter 515 provides divided clock signals to NTZ block 517. Three-phase clock generator/NTZ decoder block 517 is comprised of gates 843, 845, 847, and 849 and provides CLK1 signal to D flip-flop 809, CLK2 signal to decision-directed latch 503 and up/down counter 865, and CLK3 signal to clock inhibit block 511 and latch 867. Clock inhibit block 511 is comprised of flipflops 855 and 857, along with gates 851 and 859. Up/down counter 865 and latch 867 are denoted as UDCNTR and DACLATCH, respectively.

REFDIV circuit block 805 contains CML divide-by-4 block and divide-by-2 counter for division of the reference clock FREF/FREFB. Inputs FREF and FREFB are coupled to nodes 881 and 883 respectively, which are coupled to REFDIV 805. Block 805 provides outputs to TWG 807 through nodes 893 and 895, to gate 831 through node 901, and to phase latch 803 through nodes 889 and 891. Gate 831 provides an output to inverter 833 through node 903, which is also coupled to D flipflop 825. Inverter 833 provides an output to node 905, which is coupled to D flipflops 827, 835, 837, 839, and 841. D flipflop 835 provides an output to node 927 which is coupled to AND gate 849 and D flipflop 837. D flipflop 835 also provides an output to node 929, which is coupled to NAND gate 845. D flipflop 837 provides an output to node 931, which is coupled to AND gate 847 and D flipflop 839. D flipflop 837 also provides an output to node 933, which is coupled to AND gate 849. D flipflop 839 provides an output to node 935, which is coupled to AND gate 843 and D flipflop 841. D flipflop 839 also provides an output to node 937, which is coupled to AND gates 845 and 847. D flipflop 841 provides an output to node 939. D flipflop 841 also provides an output to node 941, which is coupled to AND gate 843 and D flipflop 835. AND gate 843 outputs CLK3 signal to node 943, which is coupled to OR gate 859 and DAC latch 867. AND gate 849 provides CLK1 signal to D flipflop 809 through node 947. AND gate 847 provides CLK2 signal to NAND gate 813, NAND gate 815, and up/down counter 865 through node 953. AND gate 845 outputs to node 955, which is coupled to D flipflop 855. OR gate 859 outputs to node 957, which is coupled to D flipflop 857.

FTR bus provides CALSTART signal to D flipflop 823 through node 907. D flipflop 823 provides an output to node 909, which is coupled to D flipflop 825 and NAND gate 821. D flipflop 825 provides an output to node 911, which is coupled to D flipflop 827 and NAND gate 821. NAND gate 821 outputs START signal to node 917, which is coupled to D flipflop 811 and inverter 853. Inverter 853 outputs START* signal to node 919, which is coupled to D flipflop 861. D flipflop 827 provides an output to node 913, which is coupled to OR gate 829. Input EN is coupled to node 879, which is coupled to inverter 817 and NAND gate 819. Inverter 817 outputs EN* signal to node 963, which is coupled to D flipflop 809, D flipflop 811, OR gate 829, and D flipflops 825 and 827.

D flipflop 809 provides an output to node 949, which is coupled to NAND gate 815 and up/down counter 865. D flipflop 809 also provides an output to node 951, which is coupled to up/down counter 865 and NAND gate 813. D flipflop 811 provides an output to node 959, which is coupled to NAND gate 813 and EX-OR gate 851. D flipflop 811 also provides an output to node 961, which is coupled NAND gate 815. NAND 813 outputs to node 965, which is coupled to NAND gate 819. NAND gate 815 outputs to node 967, which is coupled to NAND gate 819. NAND gate 819 outputs to node 969, which is coupled to D flipflop 861. D flipflop 861 provides an output to node 923, which is coupled to inverter 863 and up/down counter 865. Inverter 863 provides CALREADY signal to FTR bus through node 925. D flipflop 861 also provides an output to node 921, which is coupled to OR gate 859 and D flipflops 835, 837, 839 and 841. EX-OR gate 851 provides an output to D flipflop 855 through node 971. D flipflop 857 provides INHB signal to node 945, which is coupled to AND gate 849.

Up/down counter 865 provides a 7-bit digital value to DACLATCH 867, which latches the value and provides a digital value onto the FT bus. Up/down counter 865 also provides EOR signal to FTR bus through node 927.

It is understood that this invention can be practiced in connection with filter apparatus other than integrated continuous time filters. For example, in any filter capable of processing signal, a reference signal can be injected and the filter response to the injected reference signal can be monitored. It would be possible to apply the present invention to non-integrated continuous filters in some instance or to digital filters in other instances.

Thus a self-tuning method for integrated continuous filters has been described.

What is claimed is:

1. A method for tuning a continuous time filter comprising the steps of:
    providing a reference signal to said continuous time filter;
    monitoring an output signal of said continuous time filter; said output signal corresponding to a phase of said continuous time filter;
    comparing said reference signal and said output signal corresponding to said phase to generate an error signal;
    providing a calibration signal to said continuous time filter responsive to said comparison to compensate for said error signal by calibrating a cutoff frequency of the filter.

2. The method of claim 1 wherein said step of providing said reference signal to said filter comprises converting a clock signal to an analog waveform for generating said reference signal.

3. The method of claim 2 wherein said step of converting said clock signal to said analog waveform comprises generating a triangular waveform.

4. The method of claim 1 being repeated as a cycle having a period until said error signal is within a desired range.

5. The method of claim 4 wherein said period is controllable by a user.

6. The method of claim 1 wherein said step of comparing said reference signal and said output signal for generating said error signal comprises a step of preventing a spurious generation of said error signal.

7. The method of claim 6 wherein said step of preventing said spurious generation of said error signal comprises the steps of:
    identifying a time period wherein said spurious generation of said error signal can occur;
    preventing said spurious generation of said error signal during said time period.

8. The method of claim 7 wherein said step of preventing said spurious generation of said error signal comprises pulse discrimination.

9. The method of claim 7 wherein said step of preventing a spurious generation of said error signal comprises a filtering step.

10. The method of claim 1 wherein said reference signal has a reference frequency.

11. The method of claim 1 wherein said error signal is characterized by a phase error.

12. The method of claim 11 wherein said step of comparing said reference signal and said output signal comprises a step of phase comparison.

13. The method of claim 11 wherein said step of comparing said reference signal and said output signal to generate said error signal comprises a step of up/down counting.

14. The method of claim 1 wherein said calibration signal is a digital data value.

15. The method of claim 14 further comprising conversion of said digital data value to an analog value.

16. A filter tuning circuit for automatically tuning a continuous time filter comprising:
    a continuous time filter section having an input and an output, said continuous time filter section having a plurality of poles;
    a self-tuning circuit coupled to said continuous time filter section for providing a reference signal to said continuous time filter section and monitoring an output signal based on a phase of said continuous time filter section, said output signal being in response to said reference signal;
    said self-tuning circuit further comprising a comparing circuit for comparing said reference signal and said output signal of the continuous time filter based on said phase; and
    said self-tuning circuit further comprising a generating circuit coupled to said comparing circuit for providing a calibration signal to said continuous time filter responsive to said comparison, said calibration signal for tuning said continuous time filter by calibrating a cutoff frequency of the filter, said calibration signal for tuning said continuous time filter within a desired range.

17. The circuit of claim 16 wherein said filter section comprises a biquadratic circuit.

18. The circuit of claim 17 wherein said biquadratic circuit comprises a plurality of transconductance circuit and capacitive circuit.

19. The circuit of claim 16 wherein said filter further comprises a cutoff frequency bias generator coupled to said plurality of biquadratic filters.

20. The circuit of claim 16 wherein said generating circuit comprise a digital-to-analog converter (DAC).

21. The circuit of claim 16 wherein said generating circuit comprise a circuit for preventing a spurious generation of said calibration signal.

22. The circuit of claim 21 wherein said circuit for preventing said spurious generation of said calibration signal comprises a pulse discrimination circuit.

23. The circuit of claim 21 wherein said circuit for preventing said spurious generation of said calibration signal comprise a filtering circuit.

24. The circuit of claim 16 wherein said comparing circuit comprise a phase comparator.

25. The circuit of claim 16 wherein said generating circuit comprise a processing circuit coupled to said phase comparator for generating a calibration signal for said filter.

26. A method for tuning a continuous time filter comprising said steps of:
    providing a reference signal to said continuous time filter;
    monitoring a phase of an output signal from said continuous time filter, said output signal being a response of said continuous time filter to said reference signal;
    comparing said phase of said reference signal and said phase of said output signal of the continuous time filter to generate an error signal; and
    providing a calibration signal to said continuous time filter responsive to said comparison to compensate for said error signal by calibrating a cutoff frequency of the filter.

27. The method of claim 26 wherein said step of providing said reference signal to said filter comprises converting a clock signal to an analog waveform for generating said reference signal.

28. The method of claim 27 wherein said step of converting said clock signal to said analog waveform comprises generating a triangular waveform.

29. The method of claim 26 being repeated as a cycle having a period until said error signal is within a desired range.

30. The method of claim 29 wherein said period is controllable by a user.

31. The method of claim 26 wherein said step of comparing said reference signal and said output signal for generating said error signal comprises a step of preventing a spurious generation of said error signal.

32. The method of claim 31 wherein said step of preventing said spurious generation of said error signal comprises the steps of:

identifying a time period wherein said spurious generation of said error signal can occur;

preventing said spurious generation of said error signal during said time period.

33. The method of claim 32 wherein said step of preventing said spurious generation of said error signal comprises pulse discrimination.

34. The method of claim 32 wherein said step of preventing a spurious generation of said error signal comprises a filtering step.

35. The method of claim 26 wherein said error signal is characterized by a phase error.

36. The method of claim 35 wherein said step of comparing the phase of said reference signal and the phase of said output signal to generate said error signal comprises a step of up/down counting.

37. The method of claim 26 wherein said calibration signal is a digital data value.

38. The method of claim 37 further comprising conversion of said digital data value to an analog value.

39. A method for tuning a filter, comprising the steps of:

providing a reference signal to said filter;

monitoring an output signal of said filter, the output signal corresponding to a phase of said filter;

comparing the reference signal and the output signal corresponding to said phase to generate an error signal; and providing a calibration signal to generate a phase difference between said reference signal and said output signal to said filter to compensate for the error signal by calibrating a cutoff frequency of the filter.

* * * * *